United States Patent [19]

Sato et al.

[11] 4,234,175
[45] Nov. 18, 1980

[54] HIGH PRECISION POSITIONING DEVICE

[75] Inventors: Hiroshi Sato, Tokyo; Hironori Yamamoto, Yokohama, both of Japan

[73] Assignee: Canon Kabushiki Kaisha, Tokyo, Japan

[21] Appl. No.: 970,149

[22] Filed: Dec. 18, 1978

[30] Foreign Application Priority Data

Dec. 20, 1977 [JP] Japan ................................. 52-154170

[51] Int. Cl.³ ............................................. B23Q 1/02
[52] U.S. Cl. .................................................... 269/73
[58] Field of Search ............... 308/5 R, 3 A, DIG. 1; 33/174 TA, 1 M, DIG. 2; 269/71-73, 35, 55

[56] References Cited

U.S. PATENT DOCUMENTS

| 3,271,086 | 9/1966 | Deffrenne | 308/5 R |
| 3,813,789 | 6/1974 | Shelton | 33/174 TA |
| 4,129,291 | 12/1978 | Kato et al. | 269/73 |

*Primary Examiner*—Robert C. Watson
*Attorney, Agent, or Firm*—Fitzpatrick, Cella, Harper & Scinto

[57] ABSTRACT

An high precision positioning device, wherein a stage is supported for parallel movement relative to a guide member by an air bearing. If the position of the stage along a certain direction is not the desired position, the balance of the supply air pressure of a nozzle for supply air in said certain direction is changed to change the position of the stage to the desired position, thereby effecting high precision positioning of the order of micron.

2 Claims, 2 Drawing Figures

HIGH PRECISION POSITIONING DEVICE

BACKGROUND OF THE INVENTION

1. Field of the Invention

This invention relates to a high precision positioning device, and more particularly to a high precision positioning device for a floater floatingly supported by an air bearing for parallel movement relative to a guide member.

2. Description of the Prior Art

The high precision positioning device according to the present invention is applicable to instruments in many fields which require high precision positioning in X and Y directions, but description will hereinafter be made by taking as an example the high precision positioning of an XY stage in a mask aligner or a photorepeater or the like for the production of semiconductors for which a high precision is especially required.

These years have seen remarkable advance in the tendency toward minute size and high integration of the pattern of semiconductor elements, IC, LSI or the like and the pattern line width is going to be 1 to 2 $\mu$m. In promoting the minute size and high integration of the pattern, it is required to provide a printing performance which enables printing of patterns as minute as 1 to 2 $\mu$m, to accurately align about ten photomask patterns over a plurality of process steps, and to accurately position the pattern printed on semiconductor wafers by the photomask of the preceding step and the pattern of the photomask.

Generally, the accuracy with which these are positioned is required to be about 1/10 of the line width, and for the line width of 1 to 2 $\mu$m, the positioning accuracy of 0.1 to 0.2 $\mu$m has become necessary. An XY stage which will satisfy these requirements must satisfy the following conditions:

1. Being capable of effecting position measurement which satisfies the positioning accuracy;
2. The XY stage should be smoothly guided so as to be able to respond to a fine feed; and
3. Being provided with a drive mechanism which can reliably feed the XY stage in a minute unit.

According to the prior art, condition 1 above may be satisified by a laser interferometer or the like and condition 2 above may be satisfied by an air bearing guide or the like.

The present invention has been made as an effective device which satisifies condition 3 above. Heretofore, various driving methods for highly precisely positioning the XY stage have been provided such as the driving method using a combination of a motor and a feed screw, a fine feed mechanism using a piezo element or the like.

However, effecting high precision positioning of the order of micron by the use of the combination of a motor and a feed screw has required a high degree of mechanical accuracy and on the other hand, the movement span provided by the driving method using piezo or the like is of the order of 1 to 2 $\mu$m at best and moreover, to provide such a degree of movement, a voltage of several thousand volts had to be applied to a piezo element of a relatively great length, say, of the order of 30 mm.

Also, the conventional method for positioning the stage with respect to two orthogonal directions has comprised driving the XY stage along an X-direction guide to determine the position in X-direction and driving the XY stage along a Y-direction guide to determine the position in Y-direction, with the X- and Y-direction guides of the XY stage as the fixed reference.

SUMMARY OF THE INVENTION

It is an object of the present invention to provide a high precision positioning device which can accomplish positioning of the order of micron over a wide span.

Such an object may be achieved by floating a member to be positioned relative to a guide member by means of a constraining type air bearing and if the member to be positioned is not at a desired location, making unbalanced the air pressure supplied to the air bearing along a counter direction to thereby vary the clearance between the guide member and the member to be positioned.

It is another object of the present invention to provide a high precision positioning device which can accomplish positioning of the order of micron over still a wider span.

This object may be achieved by providing a guide member on a floated floater and providing the guide member with a member to be positioned.

It is a further object of the present invention to provide a positioning device which can accomplish positioning relative to two directions orthogonal to each other in a plane.

This object may be achieved by causing the member to be positioned to be floated relative to X and Y guides by means of air bearings.

The invention will become more fully apparent from the following detailed description thereof taken in conjunction with the accompanying drawings.

DESCRIPTION OF THE PREFERRED EMBODIMENTS

Figure 1:
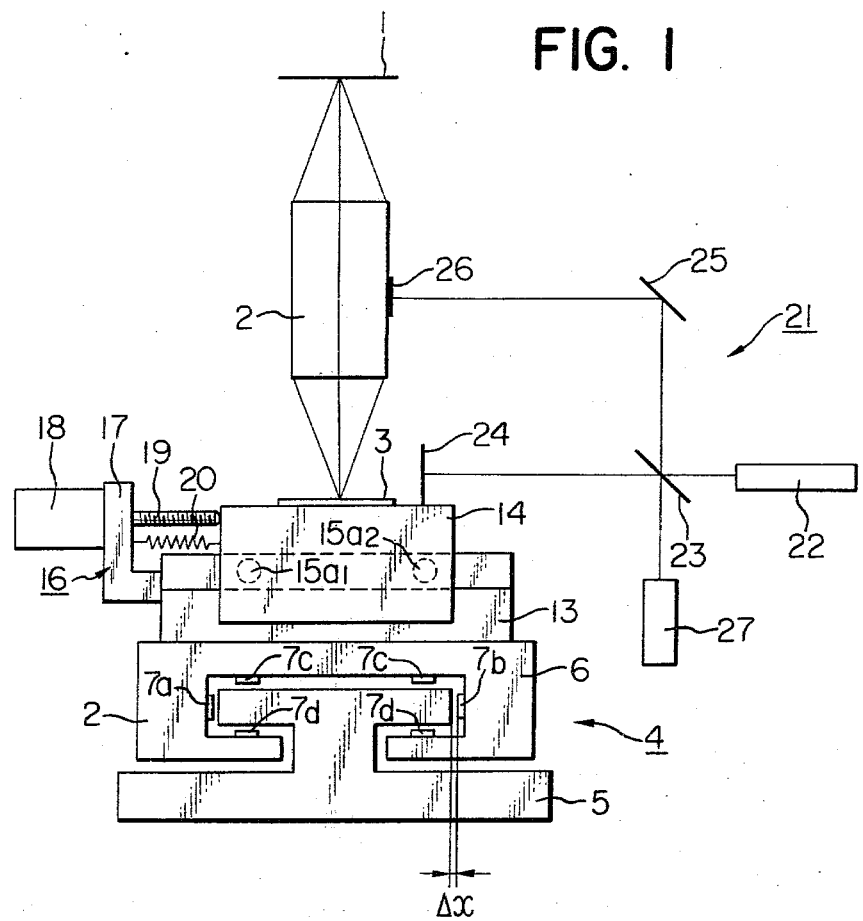
FIG. 1 schematically shows the constraining type air bearing XY stage of the present invention.
Figure 2:
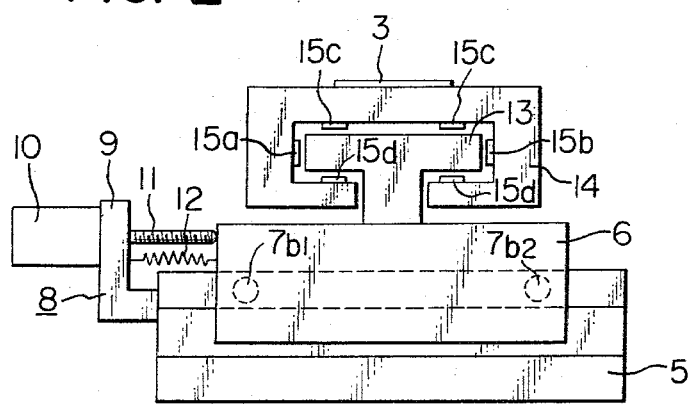
FIG. 2 is a side view corresponding to FIG. 1.

Referring to FIG. 1, it shows a printer for the manufacture of semiconductor circuit elements to which the positioning device of the present invention is applied. Designated by 1 is a mask supported by an unshown mask carrier, and 2 a projecting optical system for forming the image of the mask 1 on a wafer 3. The mask 1 and the projecting optical system 2 are stationary. Accordingly, the wafer 3 is movably supported by an XY parallel moving mechanism 4 to bring the image of the mask 1 and the wafer 3 into a desired positional relationship. Designated by 5 is a Y-direction guide of the parallel moving mechanism 4 and it is stationary. Denoted by 6 is a first floater movable along the guide 5 in the direction of depth in FIG. 1 or in the leftward and rightward direction in FIG. 2 (hereinafter simply referred to as the Y-direction). Numerals 7a, 7b, 7c and 7d designate injection holes through which a high-pressure gas, for example, air is injected. The first floater 6 is floated relative to the Y-direction guide 5 by the high-pressure air from these injection holes. Denoted by 8 in FIG. 2 is a mechanism for coarsely moving the first floater 6 in the Y-direction. The mechanism 8 comprises an L-shaped arm 9 secured to the Y-direction guide 5, a motor 10, a screw stock 11 connected to the rotary shaft of the motor 10 and movable in the Y-direction, and a return spring 12. Thus, when the motor 10 is rotated to move the screw stock 11 in the positive (rightward) direction, the first floater 6 is moved along the Y-direction guide 5 in the positive direction, and when the screw stock 11 is moved in the negative direction, the first floater 6 is moved in the negative direction by the return spring 12.

Turning back to FIG. 1, numeral 13 denotes an X-direction guide secured to the first floater 6. On this guide 13, a second floater 14, namely, a stage supporting thereon the wafer 3, is supported for movement in X-direction relative to the X-direction guide by a constraining type air bearing. This air bearing comprises air injection holes 15a, 15b, 15c and 15d, as shown in FIG. 2. Designated by 16 is an X-direction coarse moving mechanism which comprises an L-shaped arm 17, a motor 18, a screw stock 19 and a return spring 20 as does the Y-direction coarse moving mechanism 8.

Denoted by 21 is an interferometer for detecting the amount of movement of the second floater 14 in the X-direction relative to the optic axis of the projection lens 2. Designated by 22 is a laser light source, 23 a half-mirror, and 24, 25, 26 are mirrors. Numeral 27 denotes a light detector. A similar interferometer is disposed perpendicularly to the interferometer 21 for detecting the amount of movement of the second floater 14 in the Y-direction.

Operation will now be described.

Assume that uniform-pressure air is supplied to the air injection holes 7a and 7b and that the wafer is positioned at a location deviated by several microns in the X-direction. First, the air pressure supplied to the left and right air injection holes 7a and 7b are adjusted unbalancedly by a valve. Both air pressures may be changed, but for simplicity, description is made of the case where only one air pressure is changed. If the wafer 3 is moved at first rightwardly by several microns, and when the air pressure at the air hole 7b is made constant and the air pressure at the air hole 7a is changed by gradually closing the valve, then the floater 6 is moved rightwardly to vary the clearance $\Delta X$ between the guide 5 and the floater 6. This $\Delta X$ corresponds to the amount of movement, and this amount of movement is detected by the interferometer 21. When the several microns of movement of the first floater 6 is counted by the interferometer, the closing of the valve is stopped and thus, the wafer is positioned at a predetermined location.

Next, where the wafer is deviated from a predetermined location greatly, for example, in the order of centimeter, in X, Y directions, the drive motor 18 is first driven to cause the feed screw 19 to move the slide 14 in the X-direction and the drive motor 18 is stopped at a stage in which a positioning accuracy of the order of 1 $\mu$m is obtained, by the output signal from the laser interferometer 21.

Thereafter, the supply pressures at 7a and 7b of the air supply holes mounted to the Y-direction slide 2 which constrain the left and the right are controlled by the output signal from the laser interferometer to vary the clearance $\Delta X$ to thereby move the Y-direction slide 6 in the X-direction and position the wafer 3 with a high accuracy less than 0.1 $\mu$m.

Likewise, for the Y-direction, the Y-direction slide 6 is positioned with an accuracy of the order of 1 $\mu$m by the drive motor 10, whereafter the supply pressures of the air supply pads 15a and 15b which constrain the left and the right of the X-direction slide 14 are controlled to effect highly accurate positioning in the Y-direction.

Of course, in this case, although not shown, the portions of contact between the feed screw 19 and the X-direction slide 14 and between the feed screw 11 and the Y-direction slide 6 are formed with a sufficiently low friction so as not to affect the positioning with an accuracy less than 0.1 $\mu$m.

According to the present embodiment, the control of the clearance of 0.1 $\mu$m can be easily accomplished by changing the supply pressure difference to the air supply pads constraining the left and the right by about 0.05 atmospheric pressure.

Also, by controlling the supply pressure difference between the air supply pads $15a_1$ and $15a_2$ or $7b_1$ and $7b_2$ arranged along the direction of movement of the slide, it is possible to finely rotate the slide relative to the guide, and it is further possible to measure the amount of rotation resulting from the meandering of the XY stage from the laser interferometer and correct the rotational component of the XY stage by the output signal from the laser interferometer.

What we claim is:

1. A device for effecting high precision positioning with respect to two directions orthogonal to each other in a plane, comprising:

a first guide member for guiding a first guided member in a first direction;

a first gas bearing for floatingly supporting said first guided member relative to said first guide member;

a second guide member secured to said first guided member for guiding a second guided member in a second direction perpendicular to said first direction;

a second gas bearing for floatingly supporting said second guided member relative to said second guide member;

a mechanism for relatively roughly moving said first guided member in the first direction along said first guide member;

means for changing and adjusting the gas pressure of a part of said first gas bearing which part defines a floated position, in the second direction, of said first guided member to relatively finely change and adjust its position in said second direction;

a mechanism for relatively roughly moving said second guided member in the second direction along said second guide member; and means for changing and adjusting the gas pressure of a part of said second gas bearing which part defines a floated position, in the first direction, of said second guided member to relatively finely change and adjust its position in said first direction.

2. A device for effecting high precision positioning with respect to two directions orthogonal to each other in a plane, comprising:

a first guide member for guiding a first guided member in a first direction;

a first gas bearing for floatingly supporting said first guided member relative to said first guide member;

a second guide member secured to said first guided member for guiding a second guided member in a second direction perpendicular to said first direction;

a second gas bearing for floatingly supporting said second guided member relative to said second guide member;

a mechanism for relatively roughly moving said first guided member in the first direction along said first guide member;

first measuring means for finely measuring the position of the first guided member in the first direction;

means responsive to said first measuring means, for controlling the gas pressure of a part of said first gas bearing which part defines a floated position, in the first direction of said second guided member;

second measuring means for finely measuring the position of the second guided member in the second direction; and means responsive to said first measuring means for controlling the gas pressure of a part of said second gas bearing which part defines a floated position in the second direction of said first guided member.

* * * * *